United States Patent [19]

Ernyei

[11] 4,100,506
[45] Jul. 11, 1978

[54] ELECTROMECHANICAL FILTER

[75] Inventor: Herbert Ernyei, Paris, France

[73] Assignee: Societe Lignes Telegraphiques et Telephoniques, Paris, France

[21] Appl. No.: 742,467

[22] Filed: Nov. 17, 1976

[30] Foreign Application Priority Data

Nov. 20, 1975 [FR] France .................. 75 35515

[51] Int. Cl.² .............. H03H 9/04; H03H 9/26; H03H 9/32; H04R 1/22
[52] U.S. Cl. .................. 333/71; 310/321; 310/330; 333/72
[58] Field of Search ............ 333/71, 72, 30 R, 30 M, 333/70 R; 310/321-323, 328, 329, 333, 365, 366, 331, 330

[56] References Cited

U.S. PATENT DOCUMENTS

| 2,955,267 | 10/1960 | Mason | 333/71 |
| 3,953,662 | 4/1976 | Nagashima et al. | 333/71 X |

FOREIGN PATENT DOCUMENTS 7,408,317 10/1975 France .................. 333/71

Primary Examiner—Alfred E. Smith
Assistant Examiner—Marvin Nussbaum
Attorney, Agent, or Firm—Kemon & Estabrook

[57] ABSTRACT

In an electromechanical filter comprising longitudinally vibrating resonators intercoupled by means of longitudinally vibrating rods, the transducers each consist of two halves located on two flats machined on the same outermost resonator along two parallel planes.

3 Claims, 4 Drawing Figures

ELECTROMECHANICAL FILTER

BACKGROUND OF THE INVENTION

The present invention concerns improvements to an electromechanical filter which is suitable for removing a fixed frequency carrier wave from amplitude modulated signals of similar frequencies with which the said wave is mixed.

Such a filter may be used, as a non-limiting example, in a carrier current multiplex telephone system. Let us assume that the frequency of the wave which is to be separated is close to 128 kHz, the bandwidth of the filter is 50 to 100 Hz. This frequency will hereinafter be called the "useful frequency".

More specifically, the present invention relates to a filter which is not only able to separate the useful frequency, but which provides a considerable attenuation at any frequency in the neighbourhood of the frequency band centred on the useful frequency and also at frequencies more remote from the said useful frequency. In other words, the invention relates to a filter having a single pass band.

Electromechanical filters usually consist of the following parts:

a plurality of resonators disposed next to one another each formed of a cylindrical metal bar vibrating in compression-extension along its length, which is so selected as to be tuned at the useful frequency as a fundamental resonance mode, the longitudinal axes of the bars being parallel and substantially situated in a common plane;

an electromechanical input transducer which couples an external electric circuit to one of the resonators of the said plurality which will hereinafter be called for the sake of simplicity the "first resonator";

a mechanicoelectrical output transducer which couples another external circuit to another one of the said resonators, which will hereinafter be called the "last resonator";

and substantially rectilinear coupling rods which are perpendicular to the axes of the resonators, to which they are connected at points substantially midway along the length thereof, the said rods vibrating in compression-extension along their own length.

It is known to use as the transducers plates of piezoelectric ceramic material, for example of the lead-zirconiumtitanium (PZT) type, which, when a variable electric field is applied perpendicularly to their thickness, vibrate in a direction parallel to the planes of their principal faces and which conversely, in the case where they vibrate under the action of a mechanical force, develop between their opposite faces an electric field perpendicular to the latter.

Experience has shown that, although it seems at first sight that a unit such as that just defined constitutes a filter having a single narrow pass band centred on the single longitudinal resonance frequency common to the various resonators, such a unit will transmit other frequency bands between the input and output transducers which will hereinafter be called "parasitic bands" and which correspond to modes of vibration of the resonators other than the fundamental mode. Such parasitic bands are related to the mode of coupling of the transducers to the bars and are more particularly associated with flexural vibrations of the resonators, which cannot be avoided with current practice mounting arrangement between resonators and transducers.

BRIEF SUMMARY OF THE INVENTION

In accordance with the invention, it has been found that the parasitic bands may be eliminated or at least greatly attenuated by means of a novel and appropriate coupling arrangement between the outermost resonators and the transducers. In said arrangement each transducer comprises two halves located respectively on a flat cut on the same outermost bar, the two flats being parallel to each other.

In a preferred embodiment, each of the outermost resonators is simultaneously coupled to two transducer halves which are respectively mounted on two flats symmetrically disposed on the said resonator about the plane of the axes of the said resonators, the said two flats being substantially parallel to the said plane.

BRIEF DESCRIPTION OF THE DRAWINGS

The invention and its advantages will be more easily understood from the description given in the following of two preferred embodiments thereof, with reference to the accompanying drawings, in which.

DETAILED DESCRIPTION OF THE INVENTION

Figure 1:
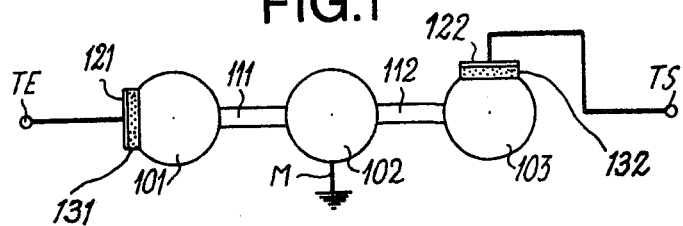
FIG. 1 illustrates the arrangement of the resonators and of the transducers in a filter of the type to which belongs the invention.

FIG. 1 is a section, taken through a plane perpendicular to the axes of the resonators and intersecting them substantially midway along their length, of a filter comprising three cylindrical resonator bars 101, 102, 103 which are coupled together by cylindrical coupling rods 111 and 112.

The useful vibration mode of the resonators 101, 102, 103 is the longitudinal compression-extension mode, in the direction of the length of these resonators, while the coupling rods 111, 112 also vibrate longitudinally along their length.

Flats parallel to the longitudinal axes of the resonators are machined in the outermost resonators 101 and 103, which flats are assumed to be oriented in any way in relation to the coupling rods 111, 112. The said flats serve to couple the input and output transducers to the filter. The said transducers each comprise a plate 131 or 132 of piezoelectric ceramic material, which is provided with an electrode 121 or 122. The electrodes 121 and 122 are connected respectively to the operating input and output terminals respectively TE and TS of the filter, while the metallic mass of the resonators is connected to a point M at constant potential, hereinafter called the "earth point". The voltage of the input signal of the filter is applied between TE and M, while the voltage of the output signal is collected between TS and M. Of course, the respective functions of the input and output transducers may be interchanged.

In known manner, when an alternating signal voltage is applied to the terminal TE, the plate 131 commences to vibrate in compression extension in a direction parallel to the longitudinal axis (direction perpendicular to the plane of the figure) of the resonator 101, which at the same time enters into vibration owing to the Poisson effect. However, this mode of vibration, which is the useful mode, is not the only possible one, because elongation in the direction in question does not occur along the axis of the bar, but along a generatrix, whereby a parasitic flexural vibration is generated in a plane containing the longitudinal axes of the resonator 101. This parasitic vibration is transmitted to the resonator 102, to the coupling rods 111 and 112, to the resonator 103 and from there through the output transducer to the terminal TS. Of course, the minimum attenuation of the parasitic signal transmitted at TS is generally as low as the required minimum attenuation for the filter and the filter is not rejected. However, one or more parasitic pass bands appear in the "attenuation-frequency" curve of the filter and experience shows that a signal transmitted in a parasitic band (52 kHz in this case) has, without selecting the orientation of the flats in relation to the coupling rods, a level which is equal to or even a number of decibels higher than that of the useful signal, for the same input voltage applied to TE (see FIG. 4, curve A corresponds to two transducers parallel to each other and to 131 as in FIG. 1).

The object of the present invention is to eliminate the parasitic signal in question without at the same time attenuating the useful signal, by means of an appropriate choice of the coupling arrangement between transducers 131 – 132 and the outermost resonators 101 and 103.

The transducers 131 and 132, which are coupled respectively to flats formed on the resonators 101 and 103, are so oriented that the plane of the first is substantially perpendicular to the common direction of the coupling rods 111 and 112, while the plane of the second is parallel to this same direction. Consequently, the flexural oscillations excited, for example, by 131 in the resonator 101, take place in a direction parallel to a plane parallel to the common direction of 111 and 112, and they retain the same direction in the resonator 103. Owing to the fact that, in the latter resonator, they are then perpendicular to the flat bearing the transducer 132, no flexural vibration is transmitted to the latter transducer because of the possible flexural oscillations of 101, or at the very least such a vibration is transmitted only with a greatly reduced amplitude. The corresponding attenuation frequency curve is B of FIG. 4. On this curve, the minimum attenuation of the parasitic band has become close to 10 dB (as compared to — 1,5 dB for curve A).

Figure 2:
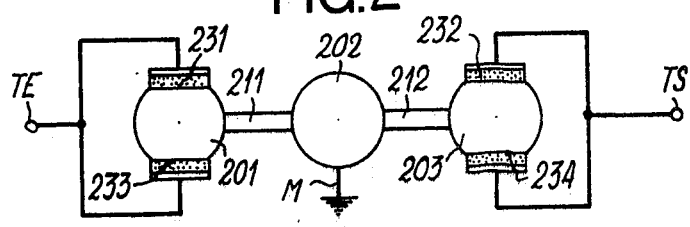
FIG. 2 illustrates the arrangement of the resonators and the transducers in the preferred embodiment of the invention.

Referring now to the preferred device of FIG. 2, the elements 201, 202, 203, 211 and 212 here perform the same respective functions as the elements 101, 102, 103, 111 and 112 of FIG. 1. On the other hand, the transducers 131 and 132 of FIG. 1 are replaced therein by a pair of input transducers (231, 233) and a pair of output transducers (232, 234). All these transducers are coupled to flat provided on the resonators 201 and 203, the planes of which flats are parallel to the longitudinal axes of the resonators and to the directon of the coupling rods 211 and 212.

It is obvious that with the device of FIG. 2, when the input transducers 231, 233 are so excited as to induce in the resonator 201 longitudinal vibrations which are perpendicular to the plane of the drawing, no flexural vibration of the same resonators can occur, because of the symmetry of the coupling arrangement. Likewise, if any residue of such a vibration were transmitted to the resonator 203, the symmetry of the transducers (232, 234) would have the effect that this latter vibration would not develop any voltage at the output terminals TS of the filter.

Figure 3:
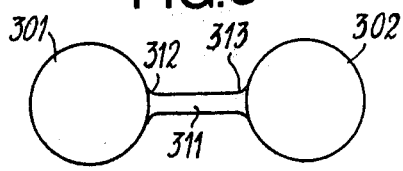
FIG. 3 illustrates a particularly advantageous mode of connection between the resonators and the coupling rods associated therewith.
Figure 4:
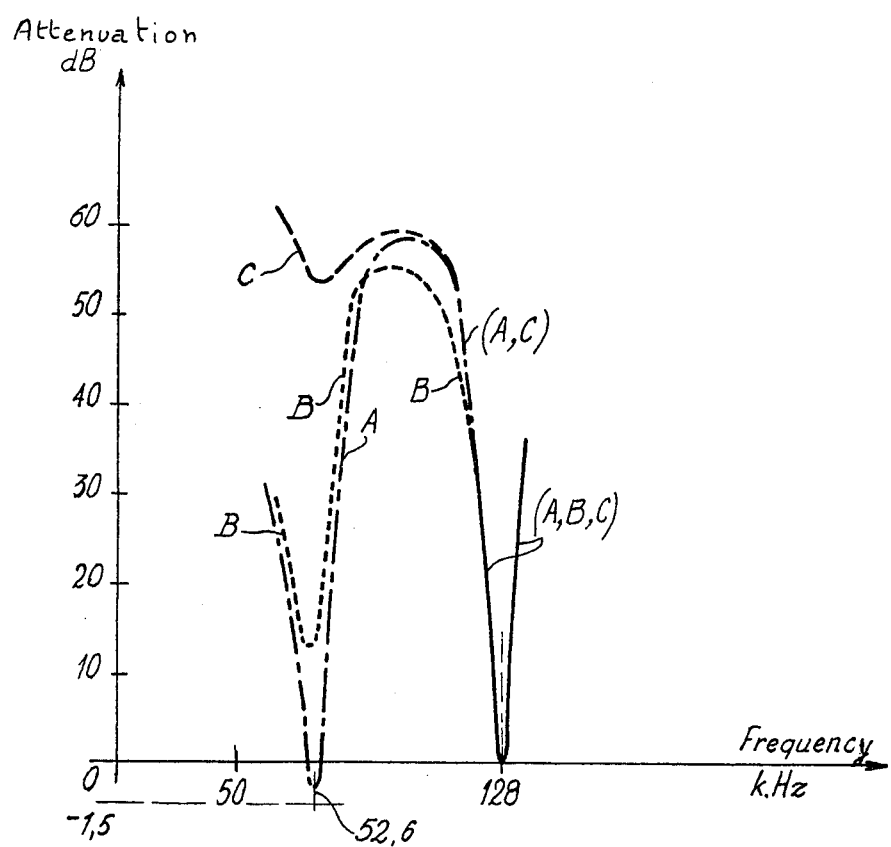
FIG. 4 illustrates a set of attenuation-frequency curves for the various filters of the type under consideration.

The attenuation as a function of the frequency of a filter according to FIG. 2 is illustrated by way of example by the curve C of FIG. 4. It will be seen from this figure that, with substantially zero attenuation at the frequency of 128 kHz, the device of FIG. 2 has an attenuation close to 60 dB for the most important parasitic band, which is located in the neighbourhood of 52 kHz which is generally considered as sufficient. Non parallelism of the flats on both outermost resonators may also be used as explained in reference to FIG. 1. FIG. 3 shows a particularly advantageous form of the coupling rods between resonators. The resonators (301, 302) are coupled by the rod 311, which is of generally cylindrical form but which has at its ends (312, 313) widened portions (of general frusto-conical form), which are electrically spot-welded to the resonators (301, 302). It has been found in practice that this form of connection is more advantageous and gives for better results than could be obtained by introducing a cylindrical coupling rod into holes drilled in the body of the resonators which it couples.

Numerical data relating to a non-limiting example of the construction of a device such as that of FIG. 2 are as follows:

metal of the resonators and coupling rods: Elinvar steel axial length of the cylindrical resonators, for 128 kHz = 18 mm diameter of the resonators = 4.5 mm diameter of the coupling rods = 0.7 mm length of the coupling rods = about 3.6 mm ceramic transducers utilizing the titanium-lead-zirconium material sold under the trade reference "P.163", manufactured by the Company "Quartz et Silice", with a length parallel to that of the resonators of 2.5 mm and a width of 1 mm, the thickness being about 0.5 mm.

With input and output impedances of 2000 ohms, the insertion loss of the filter is about 3.7 dB.

Of course, many modified embodiments of the invention are possible. For example, it is not theoretically necessary for the resonators to have a circular cylindrical surface. The term "cylindrical" must be applied thereto in its broadest connotation; instead of having a circular transverse section, the resonators could have a section of polygonal, rectangular or other form, but the circular form appears to be best adapted for ease of mechanical machining.

What we claim:

1. An electromechanical filter, having a single narrow pass band, comprising:
   a plurality of resonators of generally cylindrical shape spaced from each other and having their longitudinal axes parallel and lying in a common plane;
   coupling rods extending between and connecting each adjacent pair of said resonators, said rods having their longitudinal axes substantially perpendicular to the longitudinal axes of said resonators;
   a pair of floats formed along each outermost resonator of said plurality, said flats being parallel to the longitudinal axes of said coupling rods; and two pairs of electromechanical transducers, one pair coupled respectively to each pair of said flats to enable input and output connections to the filter.

2. A filter as defined by claim 1 in which said pair of flats are formed on opposite sides of each outermost resonator and parallel to each other.

3. A filter as defined by claim 1 wherein said coupling rods are cylindrical through most of their length but flare outwardly at each end to form frustoconical portions where they join with a resonator.

* * * * *